United States Patent
Bormann et al.

(10) Patent No.: US 6,557,146 B1
(45) Date of Patent: Apr. 29, 2003

(54) METHOD FOR THE COMPARISON OF ELECTRICAL CIRCUITS

(75) Inventors: Jörg Bormann, München (DE); Peter Warkentin, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/647,210

(22) PCT Filed: Mar. 11, 1999

(86) PCT No.: PCT/DE99/00674
§ 371 (c)(1),
(2), (4) Date: Sep. 27, 2000

(87) PCT Pub. No.: WO99/50766
PCT Pub. Date: Oct. 7, 1999

(30) Foreign Application Priority Data

Mar. 30, 1998 (DE) .......................... 198 14 109

(51) Int. Cl.[7] .............................................. G06F 17/50
(52) U.S. Cl. ............................................... 716/3
(58) Field of Search ....................... 716/3, 10

(56) References Cited

U.S. PATENT DOCUMENTS

| | | | |
|---|---|---|---|
| 4,792,909 A | * 12/1988 | Serlet ........................... | 716/10 |
| 4,803,636 A | * 2/1989 | Nishiyama et al. ............ | 716/3 |
| 4,942,536 A | * 7/1990 | Watanabe et al. .............. | 716/3 |
| 5,243,538 A | 9/1993 | Okuzawa et al. .............. | 716/5 |
| 5,331,568 A | 7/1994 | Pixley ............................ | 716/3 |
| 5,481,717 A | 1/1996 | Gaboury ...................... | 717/126 |
| 5,491,639 A | 2/1996 | Filkorn ........................ | 716/5 |

FOREIGN PATENT DOCUMENTS

WO     WO 92/18944     10/1992

* cited by examiner

*Primary Examiner*—Matthew Smith
*Assistant Examiner*—Andrea Liu
(74) *Attorney, Agent, or Firm*—Staas & Halsey LLP

(57) ABSTRACT

Various phases of the circuit design are specified in different notations, whereby each notation is based on the same circuit. Since the notations arise successively during the circuit design, whereby the circuit design covers a considerable time span, it should also be assured that a first change in a notation of an early phase corresponds to a second change in a notation of a later phase. For that purpose, the circuits underlying the notations are formally compared. Each notation describes the circuit as a boolean finite automaton, whereby a comparison of two automatons is implemented in that their input variables, output variables and operands are compared to one another. An allocation of operands corresponding to one another is determined on the basis of a status dependency graph, whereby a resolution with operands of the automatons is refined such that, preferably, corresponding allocations of operands of the automatons result. A coarsening method assures that no resolutions arise that make an allocation impossible.

8 Claims, 4 Drawing Sheets

METHOD FOR THE COMPARISON OF ELECTRICAL CIRCUITS

BACKGROUND OF THE INVENTION

This application is based on and hereby claims priority to German Patent Application No. 198 14 109.2 filed on Mar. 30, 1998, the contents of which are hereby incorporated by reference.

The invention is directed to a method for comparing electrical circuits to one another.

In the design of a digital circuit, the quality assurance before the start of production requires 30% to 70% of the entire development time. During the quality assurance, attempts to find faults in the circuit are made by intensive simulation. Even after the end of the simulation, only a part of the behavior of a digital circuit has been investigated, so that it must always be considered that faulty designs can go into production. An inconsistency in an electrical circuit noticed after the beginning of production and a correction following thereupon require time-consuming and expensive refitting work.

The quality assurance is intended to assure that description forms of different phase of the circuit design for a circuit exhibit identical input/output behavior. It is thereby customary to represent (digital) circuits as finite automatons with Boolean input/output and truth values. Prof. Dr. Hans-Jochen Schneider (Editor), "Lexikon der Informatik und Datenverarbeitung", R. Oldenbourg Verlag Munich, 1986, ISBN 3-486-22662-2, pp. 51–54. When description forms of different phases of the circuit design are compared to one another, then the circuits underlying the description forms are thereby compared.

In the framework of generating models, circuits that derive from the respective design steps are imaged onto finite automatons. A determination regarding the extent to which inputs and outputs of the automatons are to be allocated to one another follows (input/output matching). Whether identical input values also lead to identical outputs in the automatons is examined in view of this allocation. When this is not the case, a diagnosis is produced that allows the user to analyze the fault.

T. Filkorn, Symbolische Methoden für die Verifikation endlicher Zustandssysteme, Dissertation, Institut für Informatik at the Technical University, Munich, 1992, pp. 82–97. discloses a method with the object of simplifying a product machine, i.e. a combination of two automatons. The set of all status transition functions is thereby investigated and resolved into sub-sets of functions that behave identically on the set of obtainable statusses. Given automatons similar to one another, these sub-sets contain an equal number of functions from both automatons and are even often two-element, so that the allocation of the operands proceeds therefrom. One disadvantage of this method is comprised therein that differences between the two automatons do not lead to a usable result. When two status transition functions that logically belong together differ, then a correct allocation does not occur.

What is understood by status coding is a representation of a circuit in the form of an automaton, whereby this automaton comprises statusses and status transition functions.

A structural comparison of two circuits is a matter of a comparison of the combinatorial logic representing the circuit, given the assumption that the status codings of both circuits have occured in the same way.

In a sequential comparison, identical input/output behavior of two circuits is verified, whereby the respective circuits can exhibit different status.

Structurally identical automatons exhibit the same status; structurally similar automatons exhibit nearly identical status.

What is understood below by a resolution is a set that is composed of disjunctive sets. A group is an element of a resolution, whereby this element again represents a set. A sub-resolution is a sub-set of a resolution. A refinement (of a resolution) derives from the wording as a "finer" subdivision of the resolution. The relationship that has been presented is explained on the basis of a brief example:

| | |
|---|---|
| Basic set: | $\{a, b, c, d, e\}$ |
| Resolution: | $\{\{a, b\}, \{c, d\}, \{e\}\}$ |
| Group: | $\{a, b]$ or $\{c, d\}$ or $\{e\}$ |
| Sub-resolution: | for example, $\{\{a, b\}, \{e\}\}$ or $\{\{a,b\}\}$ or $\{\{c,d\}, \{e\}\}$ |
| Refinement: | $\{\{a\}, \{b\}, \{c, d\}, \{e\}\}$ |

SUMMARY OF THE INVENTION

An of the invention is to create a method for comparing electrical circuits, to thus not have to completely cover the design process, and, given different but structurally automatons, to assure an efficient comparison on the basis of an abstraction of status transition functions of the automatons, which describe the electrical circuits.

The circuits to be compared can proceed from different description forms for the design of an electrical circuit. It is to be assured that the electrical circuits corresponding to the different description forms are identical. Each description form represents a separate electrical circuit.

According to the method of the invention for comparison of electrical circuits, a representation of a first circuit is provided by a first automaton. A representation of a second circuit is provided by a second automaton. An allocation of input variables of the first automaton onto input variables of the second automaton and an allocation of output variables of the first automaton onto output variables of the second automaton is provided. A base set is provided with operands of the first and of the second automaton. Preceding from a predetermined resolution of the base set, implementing the following steps:

1) determining which data dependency exists between operands, input variables and output variables for each operand of the resolution, wherein
   determining those operands and those input variables on which a status transition function of the operand is dependent, and
   determining those operands and those output variables that are dependent on the operand for each operand;
2) combining those operands that are determined by identical data dependencies according to step 1) in a group of the resolution; and
3) implementing step 2) for all operands, so that a refinement of the resolution is determined.

Operands of the respective group are considered allocated to one another. A comparison of the two circuits underlying the automatons is implemented on the basis of the identified allocations.

A method for the comparison of electrical circuits is created wherein a first circuit is represented by a first automaton and a second circuit is represented by a second automaton. Input variables and output variables of the first automaton are imaged onto corresponding input variables and output variables of the second automaton. A basic set comprises operands of the first and of the second automaton. Proceeding from a resolution of the basic set, the following steps are implemented:

(1) For each operand of the resolution, a determination is made as to which dependencies exist between operands, input variables and output variables, whereby operands from a group can be distinguished from one another;

(2) those operands that are defined by identical data dependencies according to step (1) are combined in a group of the resolution and;

(3) step (2) is implemented for all operands, so that a refinement of the resolution is determined.

Operands of a group of the refinement are allocated to one another and a comparison of the electrical circuits underlying the automatons is implemented on the basis of the identified allocation.

One step for the comparison of two circuits that are respectively represented by a finite automaton to one another is comprised in the paired allocation of a respective operand of both automatons to one another, as a result whereof what status transition functions are to be compared and what operands are to be identified in the comparison (structural comparison) are determined.

A sequential comparison requires a predetermined variable ordering, i.e. a sequence, in which operands are noted and processed, whereby this sequence substantially determines the expense of the sequential comparison. When the variable ordering is determined with the inventive method, then a drastic reduction of the run time of the sequential comparison or a clearly reduced demand for memory capacity to be made available results.

In a development of the invention, an iteration of the method is implemented such that the refinement of the resolution is inserted as a new resolution and one continues with step (1) until no farther-reaching refinement of the resolution is determined by a next iteration.

Advantageously, an identical number of operands of the first and of the second automaton are present in a group. The group is called balanced in this case. A matching group is a two-element balanced group. When a plurality of matching groups are obtained at the end of the preferably iterative application of the method, then an unambiguous allocation of the operands contained in the respective matching group results therefrom.

In another development, a refinement of the resolution is achieved with at least one of the following possibilities:

a) In a support method, those operands and those input variables on which the status transition function of the operand x depends are determined for each operand x;

b) in an inverse support method, those operands and those output variables that are dependent on the operand are determined for each operand.

Let it be thereby noted that the basic set preferably covers all operands of both automatons. The dependency on the other operands of an automaton is determined for each operand x for the respective automaton. A possible presentation occurs on the basis of a data dependency graph. The data dependency graph comprises a node for each operand of the respective automaton and an arrow from a node u to a node v when node u lies in the support of node v. Conversely, then node v then lies in the inverse support of the node u.

Another development of the invention is that refinements are additionally generated on the basis of a simulation method in that, on the basis of value occupancies of the input variables and of the operands that are preferably randomly generated, identical value occupancies of the status transition functions underlying the operands are determined.

Another development of the invention is comprised in correcting an incorrectly determined refinement of the resolution on the basis of a coarsening method, in that groups with a respectively different number of operands of the first automaton and of the second automaton are combined in a group.

In general, unbalanced groups of the resolution wherein an allocation of operands of the two automatons to be compared cannot occur are counteracted by the coarsening method.

In the framework of an additional development of the invention, the two automatons are sequentially compared to one another. Precisely given such a sequential comparison, it is advantageous when the automatons to be compared are structurally similar. A sequential comparison occurs in that the first and the second automaton are operated with one another to form a product automaton. An input signal is applied both to the first as well as to the second automaton, and the resulting output signals of the first and of the second automaton are compared to one another. Preferably, such a comparison is implemented with an exclusive-OR operation that indicates with a output value "0" (or, respectively, "FALSE") that the output signals of the two automatons are different.

Binary decision diagrams (BDDs) are preferably utilized in the sequential comparison (also see R. Bryant, Graph-based Algorithms for Boolean Function Manipulation, IEEE Trans. on Computers, Vol.C-35, No. 8, August 1996, pp. 677–691.). A variable ordering within the BDDs determines the sequence in which the variables are proposed. How much memory the BDDs use and the time in which they can be processed are prescribed to a substantial extent by the variable ordering.

The method of the invention can be utilized for determining the variable ordering. Thus, the variable ordering is determined according to the identified allocations of the operands in that operands allocated to one another are arranged behind one another.

Exemplary embodiments of the invention are presented in greater detail on the basis of the following Figures.

DESCRIPTION OF THE PREFERRED EMBODIMENTS

Figure 1:
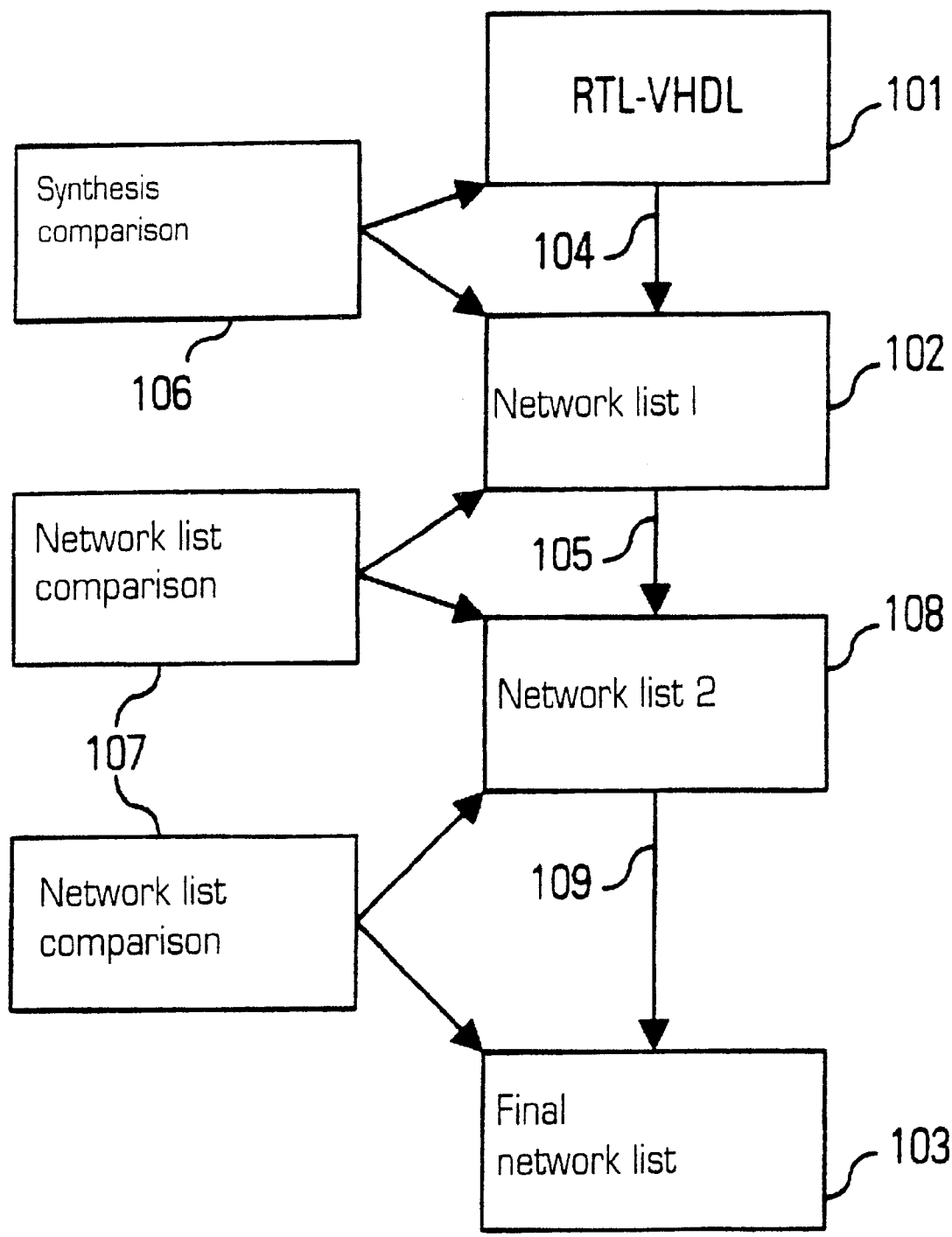
FIG. 1 shows a block diagram that shows various stages of the circuit design.

FIG. 1 shows a block diagram that shows various stages (also: phases) of the circuit design.

A circuit can be described in various ways. In a step 101, a circuit is described on register transfer level (RTL). A first network list 102 is produced in a first synthesis step 104; and a second network list 108 is produced in a second synthesis step 105. Such network lists are presented in different notation. A final network list 103 is produced from the first network list 102 in a plurality of steps 104, 105 and 109. The circuit is placed in production with the final network list 103.

The steps 104, 105 and 109 preferably comprise an optimization of the logic, whereby the number of flip-flops after the optimization is equal to the number of flip-flops before the optimization. Further, what is referred to as a "scan path" is preferably inserted into the circuit, this enabling a testing of the component (chip) that is produced later. A basic clock is usually also correspondingly divided, so that this is available with good quality at various locations in the component ("clock tree").

A circuit undergoes a number of phases during the design process, whereby several months pass before a corresponding, final network list 103 has arisen from the RTL description. When changes in the RTL description are made during the design process, for example due to suddenly occurring faults, then this usually has significant influence on the network lists 102, 108 and, accordingly, on the final network list 103 as well. Preventing, in particular, a renewed run-through of the entire development process and, thus, minimizing the enormous time expenditure is possible on the basis of the present invention.

Both the RTL description 101, the network lists 102 and 108 as well as the final network list 103 represent independent descriptions of a single circuit. In order to assure that the same circuit is really presented by the individual descriptions, the descriptions are compared to one another. What is referred to as a synthesis comparison 106 is made between the RTL description 101 and the network lists 102, 108, and what is referred to as a network list comparison 107 is made between the network lists 102 and 108 or 102 and 103. The circuits on which the respective descriptions are based are compared to one another and differences are discovered on the basis of the formal verification.

Fundamentally, every individual process step can be compared to another process step, i.e. each description form can be compared to every other description form.

Each description is based on a boolean automaton that comprises input and output variables. When two of the automatons are compared to one another, then the input variables of the first automaton are to be imaged onto input variables of the second automaton and, correspondingly, to image the output variables of the first automaton onto output variables of the second automaton. Further, numerous operands, whose behavior is described with status transition functions, exist in the automatons. Another goal of the invention is to allocate operands of the first automaton to operands of the second automaton, whereby every individual operand of the first automaton should be allocated to an operand of the second automaton, insofar as possible. A paired comparison of operands enables a verification of the two automatons.

In view of their behavior in the different descriptions 101, 102, 108 or 103, the finite boolean automatons do not exhibit any great differences since, of course, the same circuit is described (in the ideal case). In particular, the invention employs status dependency graphs in order to draw conclusions about the significance of the operands and produce an allocation of the operands between the automatons. Such status dependencies are shown by way of example in FIGS. 3 and 4.

Notations and names are introduced that are of significance below for the explanation of the invention:
For two sets A and B,
    A+B denotes the union,
    A*B denotes the section (meet),
    A−B denotes the set difference, and
    { } denotes the empty set.
A set of disjunctive, non-empty sets whose union yields M is called a resolution Z of a set M. An element from Z is called a group from Z below. The refinement Z' of a resolution Z of the set M is a resolution of M with the property that each element of Z' is a sub-set (possibly untrue) of a group from Z.
Let a factorization A/U of a sub-set A of N with respect to a sub-set U of the resolution Z of M be the set of groups from U that contain the elements of A.
Example $$Z=\{\{1, 2\}, \{3, 4, 45\}, \{6, 7, 8\}\};$$

$$U=\{\{1, 2\}, \{3, 4, 5\}\}$$

and $$A=\{1, 6, 7\}.$$

The following thus derives:

$$A/U=\{\{1, 2\}\}.$$

If M be a set of variables and B be the set of boolean values {true, false}, then let B**M reference the set of all possible occupations of the variables with boolean values.
A boolean finite automaton is characterized by
    the set I of its input variables (also: start variables),
    the set S of its operands,
    the boolean status transition function belonging to the set S that images the set B**(S*I) to B**S,
    the set O of its output variables (also: end variables),
    the boolean output function belonging to the set O that images BS(S+I) to BO, and
    INIT, a set of initial statusses that is a sub-set of B**S.
It is assumed below that the operands, input variables and output variables of the two automatons have different names. From now on, let S be the set of operands of both automatons. A set of variables is called balanced when it contains the number of variables from each of the automatons. A matching group is a two-element balanced set.

A successive refinement of the set S of all statusses of both automatons is achieved with the invention. The individual resolutions should thereby be of such a nature that potentially allocated operands always lie in the same group. An unambiguous allocation is defined by matching groups.

First, input and output variables of the two automatons are allocated to one another. The input variables and output variables in an automaton are replaced by the respectively allocated input variables and output variables of the other automaton.

The method begins with a suitable initial resolution $Z_0$ of S. The trivial resolution {S} is preferably employed therefor.

The method defines a sequence $Z_0$, $Z_1$, $Z_2$, . . . of resolutions. $Z_{i+1}$, is thereby generally a refinement of $Z_i$ that is calculated on the basis of the methods described below.

The support method, the inverse support method and the simulation method are refinement methods. Which refinement methods are applied in which sequence is dependent on the respective, individual case. The method is ended when the resolution $Z_i$ is composed only of matching groups or when no true refinement is achieved bu a further refinement step.

In the support method, a determination is made for each operand x regarding the operands and input variables on which its status transition function depends. This set is called Support D(x) of x. The Support D(x) is modified such that variables of a group can be distinguished therein in that exactly one representative is defined for each group in the resolution $Z_i$ and the variables in the Support D(x) are replaced by their representatives. Two operands enter into the same group in the new resolution precisely when their modified support is the same and they were contained in the same group of the resolution $Z_i$.

The inverse support method is similar to the support method: instead of the support D(x) of an operand x, the inverse support R(x) of the operand x is determined. This corresponds to the set of all operands and output variables whose functions are dependent on the operands x.

The simulation methods determines—preferably randomly—a plurality of value occupations for all input variables and operands wherein elements of a group always have the same value. For each operand, the results of its status transition function are then calculated under these value occupations. Two operands enter into the same group in the new resolution precisely when these results are the same and they were already in the same group previously.

What all refinement methods have in common is that they calculate a certain information for each operand and do not distinguish between elements of a group of $Z_i$ in this calculation. Consequently, two operands that belong together from two structurally equivalent automatons are not pulled apart.

A detailed description of how the respectively next resolution $Z_{i+1}$ is calculated from a resolution $Z_i$ follows.

Support Method

When I is the set of all input variables and IM is the resolution of I that corresponds to the image of the input variables (=input matching), then Y=IM+$Z_i$ is a resolution of I+S.

U references a sub-set from Y. Further, let G be a group from $Z_i$ that is not a matching group. The support D of its status transition function is determined for each operand x. G is divided such that operands with the same factorization D/U lie in the same sub-group and operands with different factorization D/U lie in different sub-groups. This is implemented for each group G from $Z_i$ that is not a matching group. $Z_{i+1}$ is composed of all sub-groups that derive in this way and of all matching groups from $Z_i$.

The exact selection of U is preferably left up to the user. Possibilities for the selection of U are the sub-set of the matching groups of Y, the sub-sets of the balanced groups of Y or the entire set Y.

Inverse Support Method

O references the set of all output variables and OM references the resolution into matching groups that corresponds to the allocation of the output variables (output matching). Further, let X=OM+$Z_i$ be a resolution of O+S. U is a sub-set from X. The above-described criteria apply for the selection of O. G is a group from $Z_i$ that is not a matching group. The set R of the operands and output variables in the support of which x occurs is determined for each operand x from G. G is divided such that operands with the same factorization R/U lie in the same sub-group and operands with different factorization R/U lie in different sub-groups. This is carried out for all G from $Z_i$ that are not matching groups. $Z_{i+1}$ is composed of all sub-groups that thereby result and of the matching groups from $Z_i$.

Implementation by Representatives

In the implementation of the support method, the factorization D/U is not presented by a set of sets but by a set of representatives. For the purpose, a representative set V is defined for U, i.e. a set that contains exactly one element from each group from U. In order to obtain the representative presentation of D/U, it suffices to investigate each element a from the support D. When there is a group in U that contains a, then a is replaced by the representative of this group; otherwise, it is deleted.

A pseudo code similar to the programming language PASCAL is employed for the following formal description of the method. The following speech constructs are thereby preferably applied:

:=variable allocation for each x in M do loop instruction that processes all elements of the set M exists v such that Cond(v) is true when there is a value for v with which Cond(v) is satisfied and occupies v with this value choose any y from M occupies y with an arbitrary element from the set M choose_subset function for the selection of the sub-set U from a resolution choose_representant defines the representative of a group is_matching_group(G) is true for a matching group G, otherwise false { } references the empty set support(x) defines the support of the operand x.

Program 1:

```
Z_new := {};
U := choose_subset(Y);
{* select representant and compute relation between
any element of a group and its representant *}
V := {};
for each G in U do
begin
    v := choose_representant(G);
    for each y in G do V := V + {(v, y)};
end;
{* examine all groups in Zi *}
For each G in Zi
begin
    if is_matching_group(G) then
        Z_new = Z_new + {G}
    else begin
        {* compute relation between element and factorized support *}
        SupportRelation = {};
        for each x in G do
        begin
            D := Support(x);
            {* factorize support *}
            D_fak := {};
            for each d in D do
                if exists v such that (v, d) in V
                then D_fak := D_fak + {v};
            SupportRelation := SupportRelation + {(x,D_fak)};
        end;
        {* split G according to different supports *}
        repeat
            {* take some element *}
            choose any (x, D_fak) from SupportRelation;
            G_new := {x};
            SupportRelation := SupportRelation − {(x, D_fak)}
            while exists y such that (y, D_fak) in SupportRelation
            begin
                G_new := G_new + {y};
                SupportRelation := SupportRelation {(y, D_fak)};
            end
            Z_new := Z_new + {G_new};
```

```
-continued

Program 1:

until SupportRelation = {};
  end;
end;
```

The inverse support method is implemented analogous thereto.

Alternative Implementation

The alternative implementation of the inverse support method presented below avoids an explicit determination of the inverse support. The support D(M) for each group M from U is defined as a union of the support of the elements of M. Each group G from $Z_i$ that is not a matching group is split such that two elements x and y from G come to lie in the same sub-group when it applies for each M from U that x and y either both lie in D(M) or neither of the two lies therein. Otherwise, they should be contained in different sub-groups. $Z_{i+1}$ again contains all sub-groups that have arisen in this way and the matching groups from $Z_i$.

Program 2 shows a possible implementation of the method. The same notation as described above applies, whereby matching_groups(Z) references the set of matching groups of Z.

```
Program 2:

ZG := Zi-matching_groups(Zi);
for each M in U do
begin
  ZGnew := {};
  D := Support(M);
  for each G in ZG do
  begin
    A := G-D;
    if (A = {} or A = G)
      then ZGnew := ZGnew + {G}
      else ZGnew := ZGnew + {A, G * D};
  end;
  ZG = ZGnew;
end;
Zi+1 = ZGnew + matching_groups(Zi);
```

This alternative implementation is based thereon that y lies in the support D(x) of an operand x precisely when the operand x lies in the inverse support R(y). For each M from U, x from D(M) is thus equivalent to M from R(x)/U. As a result of the alternative implementation, two operands x and y remain in the same group of $Z_{i+1}$ when they lie in the same group of $Z_i$ and when each D(M) contains either both or neither, i.e. when R(x)/U and R(y)/U both contain M or neither contains M. R(x)/U and R(y)/U are thus also equal because they must be sub-sets of U. Conversely, x and y are separated from a group of $Z_i$ when there is at least one M, so that one of the two operands lies in D(M) and the other does not. M is then contained in only one of the two factor sets R(x)/U and R(y)/U and R(x)/U or, respectively, R(y)/U are different. The division $Z_{i+1}$ is thus the same that is also obtained by the application of the inverse support method.

Analogous to this implementation, the support method can also be implemented upon employment of the inverse support.

Simulation Method

Let, as declared above, $Y=IM+Z_i$ apply as a resolution of I+S. x is an operand and $f_x$ is the corresponding status transition function. Let P be a set of value occupations of the operands and input variables that is selected such that variables from the same group of Y are occupied with the same values. P will generally be only a small selection of all possible value occupations. In particular, the set P can be arbitrarily defined.

Each group from $Z_i$ that is not a matching group is split into sub-groups, so that two elements x and y from G lie in the same sub-group precisely when their status transition functions $f_x$ and $f_y$ supply the same values for all value occupations from P. $Z_{i+1}$ is again formed from the sub-groups deriving in this way and from the matching groups from $Z_i$.

Program 3 shows an implementation of the simulation method. The designations as above again apply, plus:

P references the set of simulation stimuli, i.e. nearly arbitrary test occupations $f_x(v)$ references the application of the status transition function of x to the value occupation v generate_patterns(Y) defines the set P, whereby Y is handed over as parameter because the value occupations for all variables of a group of Y should be the same.

```
Program 3:

ZGnew :={};
ZG := Zi - matching_groups(Zi);
P := generate_patterns(Zi + IM);
for each v in P do
begin
  ZGnew := {};
  for each G in ZG do
  begin
    choose any x from G
    A := {x};
    B := {};
    G := G - {x};
    Ref := fx(v);
    for each y in G do
    begin
      if Ref = fy{v}
        then A := A + {y}
        else B := B + {y}
    end;
    if B = {}
      then ZGnew := ZGnew + {A}
      else ZGnew := ZGnew + {A, B};
    ZG := ZGnew;
  end;
end;
Zi+1 := ZGnew + matching_groups(Zi);
```

Coarsening Method

The coarsening method corrects a faulty division that can derive when the automatons are in fact structurally similar but not identical. Fundamentally, unbalanced groups that have arisen in the preceding refinement steps should thereby be re-combined. For that purpose, a previously calculated resolution $Z_k$, $k \leq i$ that serves as reference resolution must be defined. For each group G from $Z_k$, the coarsening method then determines the unbalanced sub-groups in $Z_i$ that are sub-set of G. These unbalanced sub-groups are united to form a group $Z_{i+1}$. Moreover, $Z_{i+1}$ should contain all balanced groups of $Z_i$. It is desirable that additional balanced groups or even matching groups arise as a result of the unification.

The reference resolution that is selected is left up to the individual case.

However, a resolution should be selected that, on the one hand, contains optimally small groups and of which it can be assumed, on the other hand, that operands that belong together lie in the same group. Preferably, the result of the preceding coarsening method is defined as resolution $Z_k$.
Result In the ideal case, the last resolution Z that is calculated is composed only of matching groups from which an allocation of the operands directly proceeds.

Unbalanced groups or groups with more than two elements can also remain. The reason for this can, on the one hand, be that the methods are employed for the dividing abstract from the actual status transition functions and output functions. Information required for a more exact matching are lost in this abstraction. On the other hand, redundancies can be present in the circuit. When, for example, both automatons have respectively two operands x, y and x', y' to be allocated to one another and having identical status transition functions and x, y or, respectively, x', y' either lie in common or not at all in the support of the other variable, the method will terminate with a resolution in which there is a group that contains all four operands because the status transition functions supply no information for the division.

A third possible reason is comprised therein that the automatons are in fact similar but nonetheless differ such that some statusses cannot be allocated.

It is not disturbing for a sequential comparison when the result resolution contains Z groups that are not matching groups. Z is usually fine enough in order to define a new variable ordering for the larger automaton that approximately coincides with the variable ordering of the smaller automaton. The larger automaton also usually becomes smaller due to the switch to this inexactly defined variable order.

In a structural comparison, the operands in the disturbing groups must either be excluded from the comparison or the resolution must be investigated further. Such a farther-reaching investigation could be comprised therein that a user makes further inputs or an allocation is made on the basis of the names of the operands.

Figure 2:
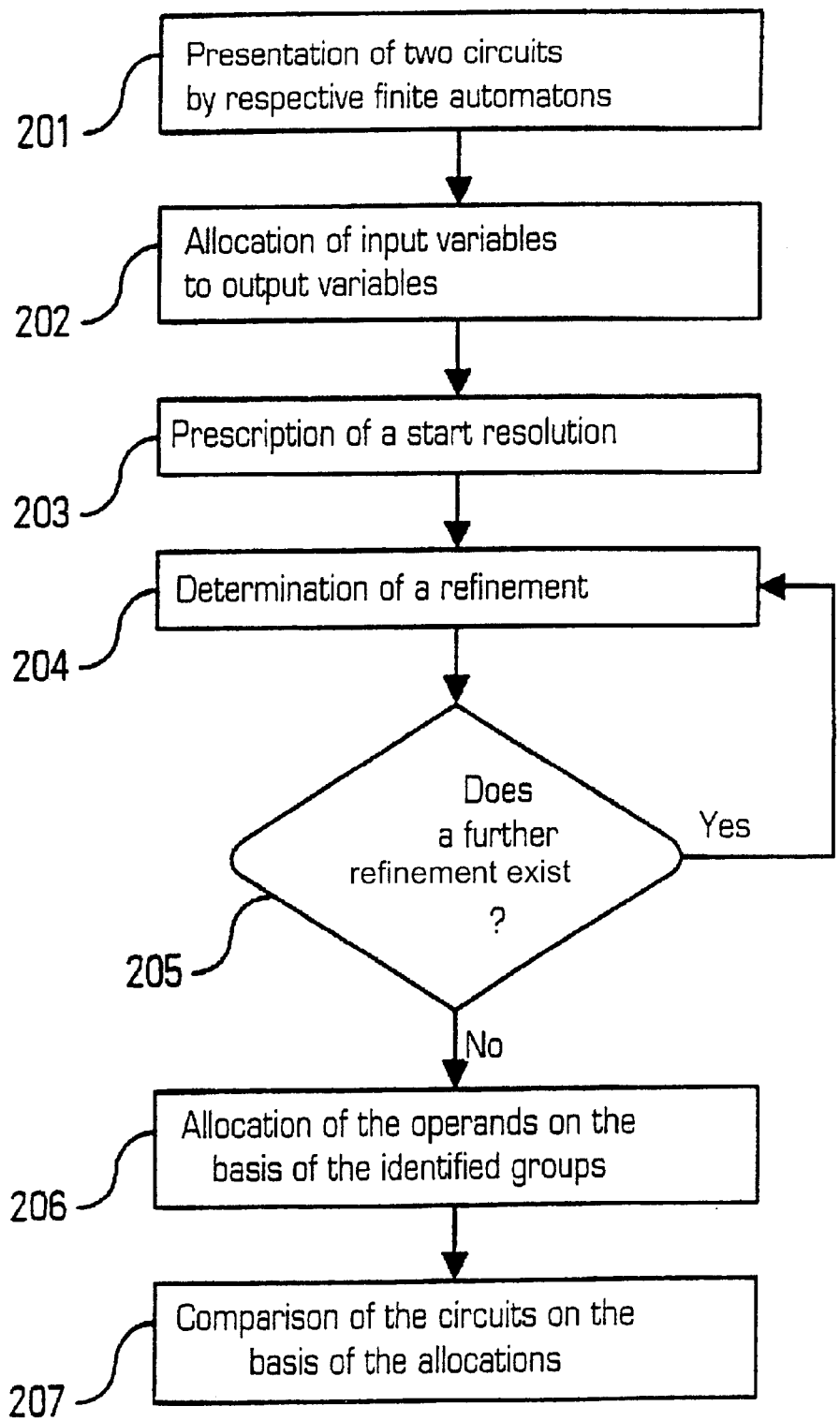
FIG. 2 illustrates a block diagram with method steps for comparing two circuits.

FIG. 2 shows a block diagram that exhibits method steps for the comparison of two circuits.

In a step 201, two circuits are respectively represented by finite automatons. Boolean automatons are preferably used for this purpose.

In a step 102, input variables of the first automaton are imaged into input variables of the second automaton (input matching) and output variables of the first automaton are imaged onto output variables of the second automaton (output matching) (allocation of the input and output variables). An initial resolution $S_0$ is prescribed in a step 203. A refinement of the initial resolution is defined in a step 204. An inquiry (see step 205) determines whether further refinements of the resolution can be defined. When this is not the case, then the operands are allocated on the basis of the identified refinement according to the specific groups of the resolution determined by the refinement (see step 206), and the circuits are compared in a step 207 on the basis of the allocation that has been made. When it turns out in the inquiry in the step 205 that further refinements can be defined, then the method is iteratively continued with step 204, i.e. the nest refinement is defined.

Examples

Example for Support Method and Inverse Support Method

Figure 3:
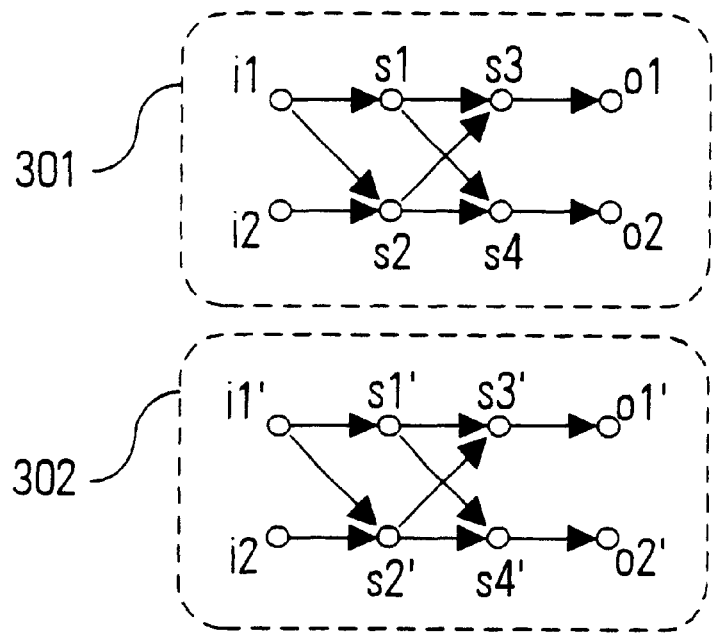
FIG. 3, shows a first sketch with two status dependency graphs.

FIG. 3 shows two status dependency graphs 301 and 302 that are investigated for differences according to the method for comparing two circuits.

The status dependency graph 301 has a node for each operand and an arrow from node u to node v when u lies in the support of v. Denoting below are:

i1, i2 input variables of the first automaton
i1', i2' input variables of the second automaton
s1, s2, s3, s4 operands of the first automaton
s1', s2', s3', s4' operands of the second automaton
o1, o2 output variables of the first automaton, and
o1', o2' output variables of the second automaton.

Upon application of the support method, the following supports can be read from the status dependency graphs:

$$D_1=\{i1\},\ D_2=\{i1, i2\},\ D_3=\{s1, s2\},\ D_4=\{s1, s2\},$$

(analogous for the second automaton).
The resolution $$Z_0=\{\{s1, s2, s3, s4, s1', s2', s3', s4'\}\}$$

of the operands forms the basis, i.e.

$$Y_0=\{\{i1, i1'\},\ \{i2, i2'\},\ (s1, s2, s3, s4, s1', s2', s3', s4'\}\}.$$

Let $U_0=Y_0$ apply and let $\{i1, i2, s1\}$ be the representative set of $U_0$.
Given identification of the representatives with the groups they represent, the following derives:

$$D_1/U_0=D_1'/U_0=\{i1\},$$

$$D_2/U_0=D_2'/U_0=\{i1, i2\}$$

$$D_3/U_0=D_3'/U_0=\{s1\},$$

$$D_4/U_0=D_4'/U_0=\{s1\}.$$

The new resolution $Z_1$ derives as:

$$Z_1=\{\{s1, s1'\},\ \{s2, s2'\},\ s3, s4, s3', s4'\}\}.$$

By renewed application of the support method, with $$Y_1=\{\{i1, i1'\},\ \{i2, i2'\},\ \{s1, s1'\},\ \{s2, s2'\},\ \{s3, s4, s3', s4'\}\}.$$

and with $U_1=Y_1$ and the representative set $\{i1, i2, s1, s2, s3\}$, the following derives:

$$D_1/U_1=D_1'/U_1=\{i1\},$$

$$D_2/U_1=D_2'/U_1=\{i1, i2\}$$

$$D_3/U_1=D_3'/U_1=\{s1, s2\}$$

$$D4/U1=D_4'/U_1=\{s1, s2\}$$

No additional refinement of $Z_1$ follows therefrom. The fact that the second application of the support method already yields no additional refinement is a special characteristic of the example.

Proceeding from $Z_1$, a farther-reaching refinement can be found on the basis of the inverse support method. The following applies:

$$R_1=\{s3, s4\},$$

$$R_2=\{s3, s4\},$$

$$R_3=\{o1\}$$

$$R_4=\{o2\}.$$

For $Z_1$, the resolution of the operands and output variables is:

$$X_1=\{\{o1, o1'\},\ \{o2, o2'\},\ \{s1, s1'\},\ \{s2, s2'\},\ \{s3, s4, s3', s4'\}\}.$$

With the representative set V={o1, o2, s1, s2, s3}, the following applies:

$$R_1/X_1 = R_{1'}/X_1 = \{s3\},$$

$$R_2/X_1 = R_{2'}/X_1 = \{s3\},$$

$$R_3/X_1 = R_{3'}/X_1 = \{o1\},$$

$$R_4/X_1 = R_{4'}/X_1 = \{o2\},$$

so that $Z_1$ is refined to:

$$Z_2 = \{\{s1, s1'\}, \{s2, s2'\}, \{s3, s3'\}, s4, s4'\}\}.$$

The allocation is unambiguously defined; only matching groups are now present.

Example of the Coarsening Method

Figure 4:
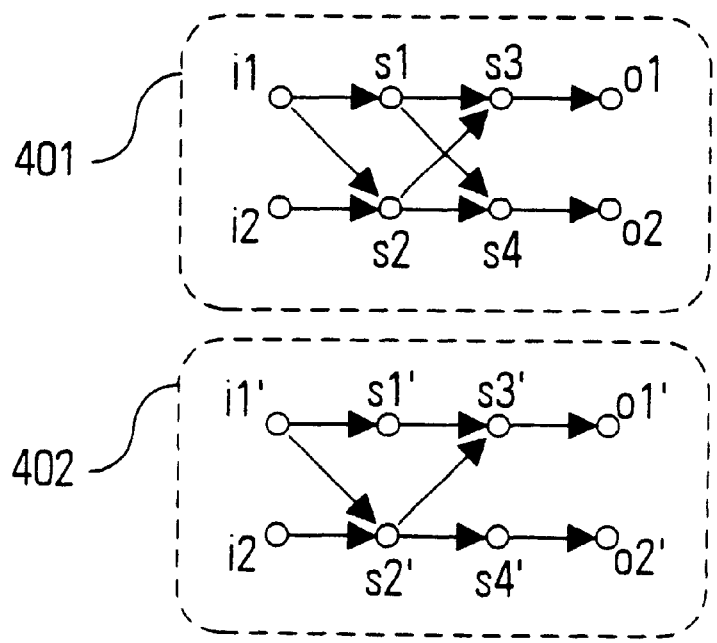
FIG. 4 illustrates a second sketch with two status dependency graphs.

FIG. 4 is considered below as an example of the coarsening method. FIG. 4 shows the two status dependency graphs 401 and 402 that are not structurally equivalent.

The first application of the support method proceeds as in the above example for FIG. 3. Although $D_{4'} = \{s2'\}$ (and not $\{s1', s2'\}$ as above) applies, this difference being compensated by the factorization to $U_0$. $Z_1$ therefore derives as above. The following, however, applies when the support method is applied anew:

$$D_1/U_1 = D_{1'}/U_1 = \{i1\},$$

$$D_2/U_1 = D_{2'}/U_1 = \{i1, i2\}$$

$$D_3/U_1 = D_{2'}/U_1 = \{s1, s2\}$$

$$D4/U_1 = \{s1, s2\} \text{ but } D_{4'}/Y_1 = \{s2\},$$

so that the group $\{s3, s3', s4, s4'\}$ for $Z_2$ would first be divided into the sub-groups $\{s3, s3', s4\}$ and $\{s4'\}$. However, the coarsening method (with k=1) recombines these sub-groups. Having operands s4 and s4' that actually belong together being pulled aprt is thereby prevented. An unambiguous allocation can again be undertaken after application of the inverse support method.

Implementation Example

In addition to the designations defined above, let the following also apply below:

Support_Methode(Z,X)

Inverse_Support_Methode(Z,X)

Simulations_Methode(Z)

Coarseningstep(Z,Z_Ref)

designate applications of the respective method (as presented in detail above). In the support method and the inverse method, X indicates how U is defined: Given X=total all groups of the resolution should be taken X=matching only the matching groups should be used.

The following designations are also employed in Program 4:

Z_Ref indicates which resolution is defined as reference resolution $Z_k$ in the coarsening step (coarsening method), completely_matched(Z) is true when all groups from Z are either matching groups or comprise only operands of one automaton.

The indicated implementation in Program 4 is a large loop that breaks off when either 'completely_matched" is satisfied or when no further division (further resolution) is found by the large loop.

The application of the individual methods is repeated until a fixed point has been reached.

Program 4:

```
Z = {S},
repeat
    Z_Reference1 = Z;
    repeat
        Z_Reference2 := Z;
        Z: = Inverse_Support_Methode(Z, matching);
        Z: = Vergröberungsschritt(Z, Z_Reference2);
    until Z = Z_Reference2;
    if completely_matched(Z) then exit;
    repeat
        Z_Reference3 = Z;
        Z := Support_Methode(Z, total);
    until Z = Z_Reference3;
    Z := Vergröberungsschritt(Z, Z_Reference2);
    if completely_matched(Z) then exit;
    repeat
        Z_Reference2: = Z;
        Z := Inverse_Support_Methode(Z, matching);
        Z := Vergröberungsschritt(Z, Z_Reference2);
    until Z = Z_Reference2;
    if completely_matched(Z) then exit;
    repeat
        Z_Reference3 = Z;
        Z: = Inverse_Support_Methode(Z, total);
    until Z = Z_Reference3;
    Z: = Vergröberungsschritt(Z, Z_Reference2);
    if completely_matched(Z) then exit;
    repeat
        Z_Reference2 := Z;
        Z := Inverse_Support_Methode(Z, matching);
        Z := Vergröberungsschritt(Z, Z_Reference2);
    until Z = Z_Reference2;
    if completely_matched(Z) then exit;
    Z := Simulations_Methode(Z);
    Z := Vergröberungsschritt(Z, Z_Reference2);
until Z = Z_Reference1;
```

Figure 5:
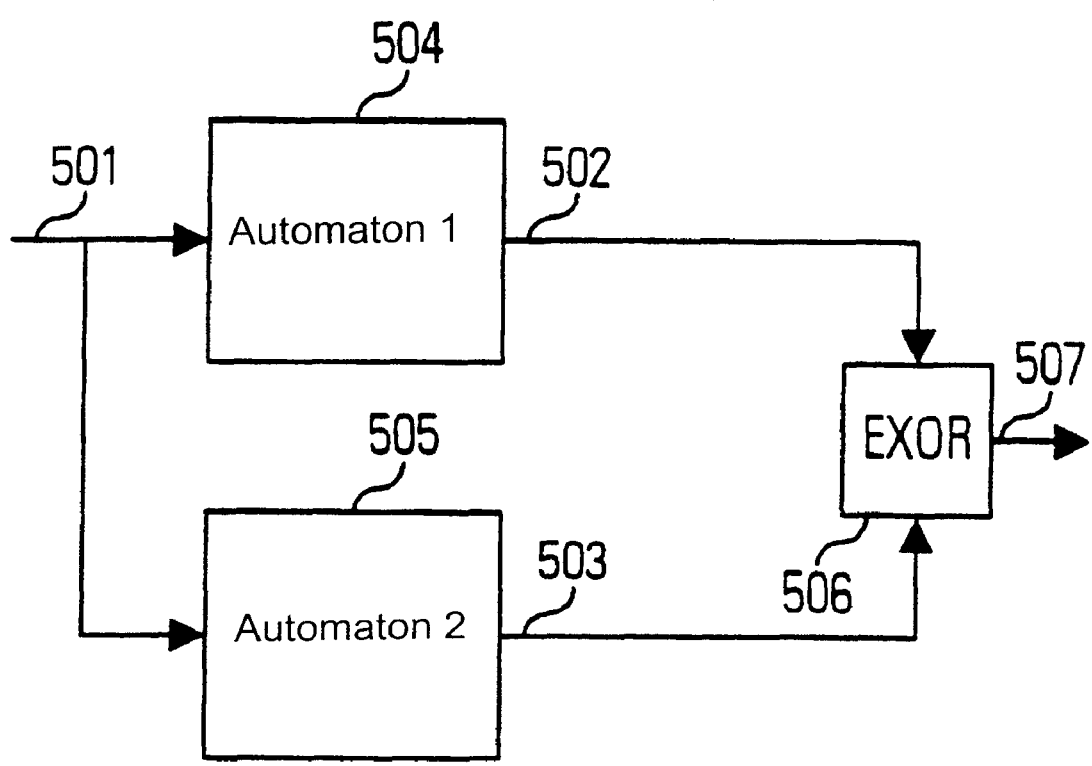
FIG. 5 illustrates a sketch that shows a product automaton that comprises a first and a second automaton.

FIG. 5 shows a product automaton that comprises a first automaton and a second automaton.

In order to implement a sequential comparison of two automatons that respectively represent an underlying electrical circuit, the two automatons 1 and 2 (see FIG. 5, 504 and 505) are interleaved in that input variables are allocated to one another and resulting output values 502 and 503 are compared to one another. The comparison preferably with an EXOR-operation that indicates an inequality of output values 502 and 503 with a logical "1".

A variable arrangement (see Bryant) that is offered by matching groups of the method of the invention is required for the sequential comparison. Advantageously, functions of the finite automatons are presented BDDs (see Bryant).

Although various minor changes and modifications might be proposed by those skilled in the art, it will be understood that our wish is to include within the claims of the patent warranted hereon all such changes and modifications as reasonably come within our contribution to the art.

The following publications are cited in the course of this document:

[1] Prof. Dr. Hans-Jochen Schneider (Editor), "Lexikon der Informatik und Datenverarbeitung", R. Oldenbourg Verlag Munich, 1986, ISBN 3-486-22662-2, pp. 51–54.

[2] T. Filkom, Symbolische Methoden für die Verifikation endlicher Zustandssysteme, Dissertation, Institut für Informatik at the Technical University, Munich, 1992, pp. 82–97.

[3] R. Bryant, Graph-based Algorithms for Boolean Function Manipulation, IEEE Trans. on Computers, Vol.C-35, No. 8, August 1996, pp. 677–691.

What is claimed is:

1. A method for comparison of electrical circuits, comprising:

providing a representation of a first circuit by a first automaton;

providing a representation of a second circuit by a second automaton;

providing an allocation of input variables of the first automaton onto input variables of the second automaton and an allocation of output variables of the first automaton onto output variables of the second automaton;

providing a base set with operands of the first and of the second automaton, proceeding from a predetermined resolution of the base set, implementing the following steps (1) determining which data dependencies exist between operands, input variables and output variables for each operand of the resolution, wherein determining those operands and those input variables on which a status transition function of the operand is dependent, and determining those operands and those output variables that are dependent on the operand for each operand, (2) combining those operands that are determined by identical data dependencies according to step (1) in a group of the resolution, and (3) implementing step (2) for all operands, so that a refinement of the resolution is determined, whereby operands of the respective group being considered allocated to one another; and implementing a comparison of the two circuits underlying the automatons on the basis of the identified allocations.

2. The method according to claim 1, whereby an iteration is implemented such that the refinement of the resolution is utilized as a new resolution and one continues with step (1) until no further refinement is determined by a further iteration.

3. The method according to claim 1 wherein additionally, a plurality of operands are combined in a group when identical value occupations of the output variables are identified for predetermined value occupations of the input variables and the operands based on the status transition functions underlying the operands.

4. The method according to claim 1 wherein a faulty refinement is corrected in that two groups having a respectively different number of operands of the first automaton and of the second automaton are combined in a group.

5. The method according to claim 1 wherein the first automaton and the second automaton are operated to form a product automaton, whereby a variable ordering is determined in that operands that have been allocated to one another are arranged lying close to one another.

6. The method according to claim 5 wherein a sequential comparison of both circuits is implemented in that a sequence of the operands in binary decision diagrams is defined by the variable ordering.

7. A method for comparison of first and second circuits represented by first and second automata, respectively, comprising:

obtaining a predetermined resolution of a base set containing operands of the first and second automata with allocation of input and output variables of the first automaton onto input and output variables of the second automaton, respectively;

determining as data dependencies for each operand a first set of other operands and input variables on which a state transition function of the operand is dependent and a second set of other operands and output variables that are dependent on the operand;

forming groups of similar operands, where the similar operands in each group have identical data dependencies and are considered allocated to one another; and comparing the first and second circuits underlying the first and second automata based on the allocation and the groups of similar operands.

8. A method for analysis of first and second circuits represented by first and second automata, respectively, comprising:

obtaining a predetermined resolution of a base set containing operands of the first and second automata;

applying a support method and an inverse support method to identify data dependencies between the operands, input variables and output variables in the first and second automata; and forming groups of operands having identical data dependencies.

* * * * *